United States Patent
Gao et al.

(10) Patent No.: US 11,249,894 B2
(45) Date of Patent: Feb. 15, 2022

(54) STORAGE DEVICES AND DATA RETENTION METHODS THEREOF

(71) Applicant: VIA TECHNOLOGIES, INC., New Taipei (TW)

(72) Inventors: Zhongyi Gao, Beijing (CN); Xiaoyu Yang, Beijing (CN)

(73) Assignee: VIA TECHNOLOGIES, INC., New Taipei (TW)

( * ) Notice: Subject to any disclaimer, the term of this patent is extended or adjusted under 35 U.S.C. 154(b) by 136 days.

(21) Appl. No.: 16/007,025

(22) Filed: Jun. 13, 2018

(65) Prior Publication Data

US 2019/0205245 A1 Jul. 4, 2019

(30) Foreign Application Priority Data

Jan. 4, 2018 (CN) .......................... 201810007643.7

(51) Int. Cl.
*G06F 12/02* (2006.01)
*G11C 16/34* (2006.01)
*G11C 16/16* (2006.01)

(52) U.S. Cl.
CPC .......... *G06F 12/0246* (2013.01); *G11C 16/16* (2013.01); *G11C 16/349* (2013.01); *G06F 2212/7211* (2013.01)

(58) Field of Classification Search
CPC ......... G06F 12/0246; G06F 2212/7211; G06F 2212/1041; G06F 2212/1036; G11C 16/16; G11C 16/349
See application file for complete search history.

(56) References Cited

U.S. PATENT DOCUMENTS

| | | | | |
|---|---|---|---|---|
| 2006/0106972 A1* | 5/2006 | Gorobets | ............ | G06F 12/0246 711/103 |
| 2010/0174845 A1* | 7/2010 | Gorobets | ............ | G06F 12/0246 711/103 |
| 2010/0287328 A1* | 11/2010 | Feldman | ............. | G06F 12/0246 711/103 |
| 2011/0246705 A1* | 10/2011 | Mudama | ............ | G11C 16/3495 711/103 |
| 2012/0246393 A1* | 9/2012 | Hashimoto | ......... | G06F 12/0246 711/103 |
| 2013/0232290 A1* | 9/2013 | Ish | ....................... | G06F 12/0246 711/103 |
| 2013/0311702 A1* | 11/2013 | Cheng | ................. | G06F 12/0246 711/103 |
| 2014/0032993 A1* | 1/2014 | Yang | .................... | G06F 11/1068 714/773 |
| 2014/0136752 A1* | 5/2014 | Terada | ................ | G06F 12/0246 711/102 |
| 2015/0026389 A1 | 1/2015 | Li | | |
| 2015/0113207 A1* | 4/2015 | Shin | ..................... | G06F 12/0246 711/103 |

(Continued)

*Primary Examiner* — Charles Rones
*Assistant Examiner* — Tong B. Vo
(74) *Attorney, Agent, or Firm* — McClure, Qualey & Rodack, LLP

(57) ABSTRACT

A storage device includes a flash memory array and a controller. The flash memory array includes a plurality of blocks. A minimal erase number of blocks have a minimal erase count in the plurality of blocks. When one of the minimal erase number of blocks is erased, the controller subtracts 1 from the minimal erase number.

18 Claims, 7 Drawing Sheets

(56) References Cited

U.S. PATENT DOCUMENTS

| | | | |
|---|---|---|---|
| 2015/0261671 A1* | 9/2015 | Chu | G06F 12/0246 |
| | | | 711/103 |
| 2015/0339070 A1* | 11/2015 | Lee | G06F 3/0655 |
| | | | 711/103 |
| 2016/0321172 A1* | 11/2016 | Jinzenji | G06F 12/0246 |
| 2017/0278581 A1* | 9/2017 | Takizawa | G11C 16/3445 |
| 2018/0121088 A1* | 5/2018 | Doshi | G06F 3/0688 |
| 2018/0267705 A1* | 9/2018 | Liu | G06F 3/0655 |
| 2018/0322042 A1* | 11/2018 | Jang | G06F 3/0658 |

* cited by examiner

STORAGE DEVICES AND DATA RETENTION METHODS THEREOF

CROSS REFERENCE TO RELATED APPLICATIONS

This Application claims priority of China Patent Application No. 201810007643.7, filed on Jan. 4, 2018, the entirety of which is incorporated by reference herein.

BACKGROUND OF THE INVENTION

Field of the Invention

The disclosure relates generally to a flash memory device and a data retention method thereof, and more particularly it relates to a static wear-leveling method applied to a flash memory for improving the lifetime of the flash memory.

Description of the Related Art

The upper limit of the theoretical erase count of physical blocks in flash memory is continuously decreasing. This has been due to the scaling down of the process size, as well as the progress being made in multiple voltage level storage technology. In addition, since user data includes both hot data and cold data (i.e., frequently accessed data is called hot data, whereas infrequently accessed data is called cold data), each physical block may have an erase count that is different from any other's. Blocks storing hot data can be damaged when the erase count limit is reached after frequent erasing and writing operations, while blocks storing cold data cannot be fully utilized. An algorithm for static wear-leveling is proposed to fully utilize the limited life time of a flash memory.

Since the static wear-leveling algorithm is controlled by software that can interfere with the performance of a host, a bad selection strategy may lead to meaningless internal data migration. For example, a portion of hot data may be moved to a physical block having a very high erase count, making it is impossible to stop increasing the erase count of the physical block; or, physical blocks having a lower erase count (erase counts are generated during the process of accumulative use) may always be hard to erase or write to, resulting in these physical blocks being poorly utilized.

Therefore, it is necessary to optimize the static wear-leveling algorithm so as to migrate data to the most appropriate physical block at the proper time, allowing the cost to be reduced and the erase counts of the physical blocks to be well-controlled.

BRIEF SUMMARY OF THE INVENTION

In one embodiment, a storage device comprises a flash memory array and a controller. The flash memory array comprises a plurality of blocks. A minimal erase number of blocks have a minimal erase count in the plurality of blocks. When one of the minimal erase number of blocks is erased, the controller subtracts 1 from the minimal erase number.

In one embodiment, a data retention method is adopted for a flash memory array. The flash memory array comprises a plurality of blocks, and a minimum erase number of blocks have a minimum erase count in the plurality of blocks. The data retention method comprises: erasing one of the minimum erase number of blocks; and when one of the minimum erase number of blocks is erased, the minimum erase count is decreased by 1.

The embodiments provided herein would prevent the controller from scanning the flash memory array too frequently, meaning that the hardware overhead that is needed for the host to scan the flash memory array can be reduced. In addition, since the minimum erase count and the minimum erase number are stored in the flash memory array, the minimum erase count and the minimum erase number can be retained when power is suddenly lost.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
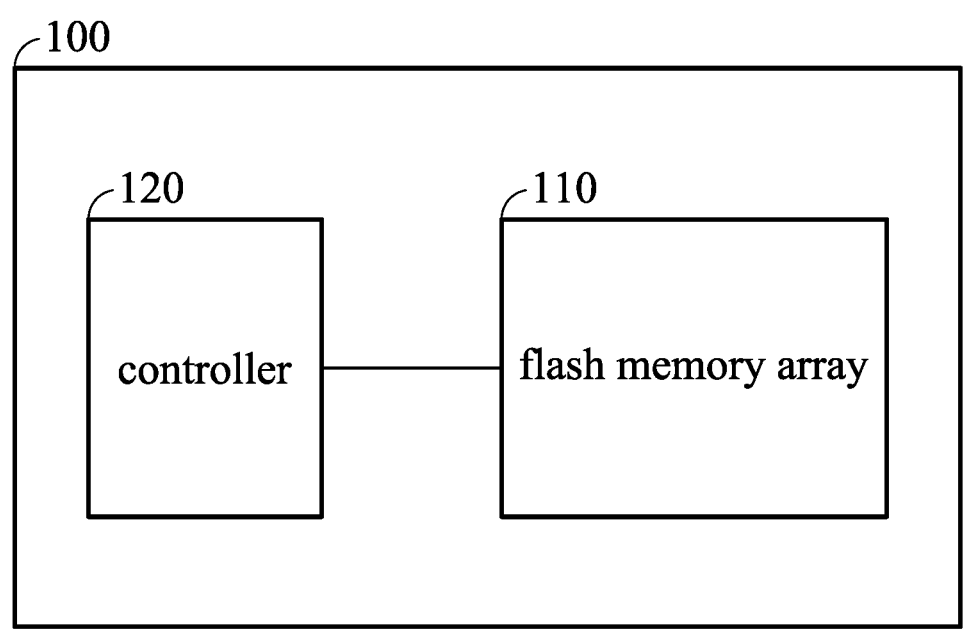
FIG. 1 is a block diagram of a storage device in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a storage device in accordance with an embodiment of the invention. As shown in FIG. 1, the storage device 100 includes a flash memory array 110 and a controller 120, in which the flash memory array 110 includes a plurality of blocks. According to an embodiment of the invention, the flash memory array 110 is a NAND flash. According to another embodiment of the invention, the flash memory array 110 is a NOR flash. The controller 120 controls the flash memory array 110 to execute all operations.

Figure 2A:
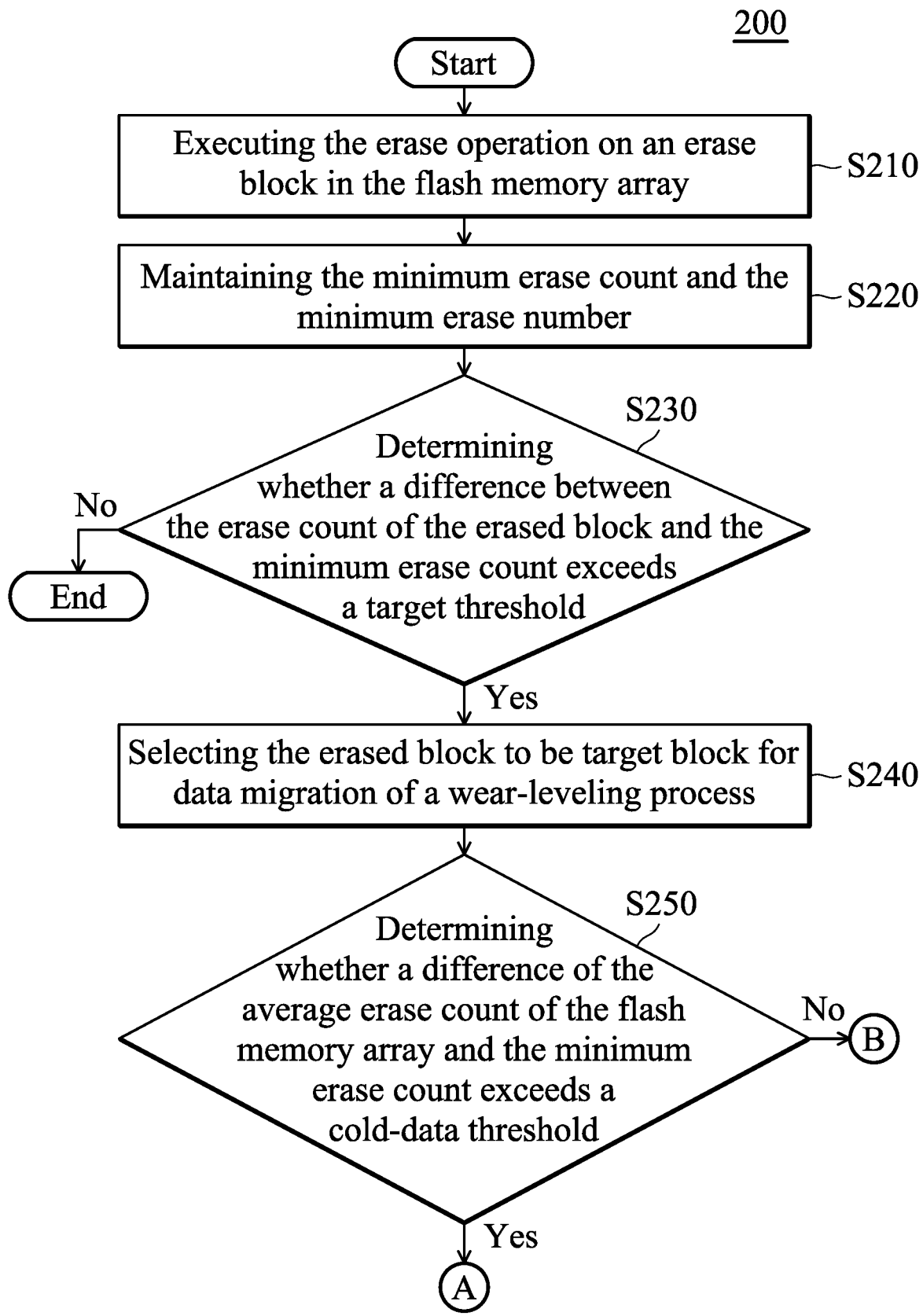
FIGS. 2A-2B are a flow chart of a data retention method in accordance with an embodiment of the invention.
Figure 2B:
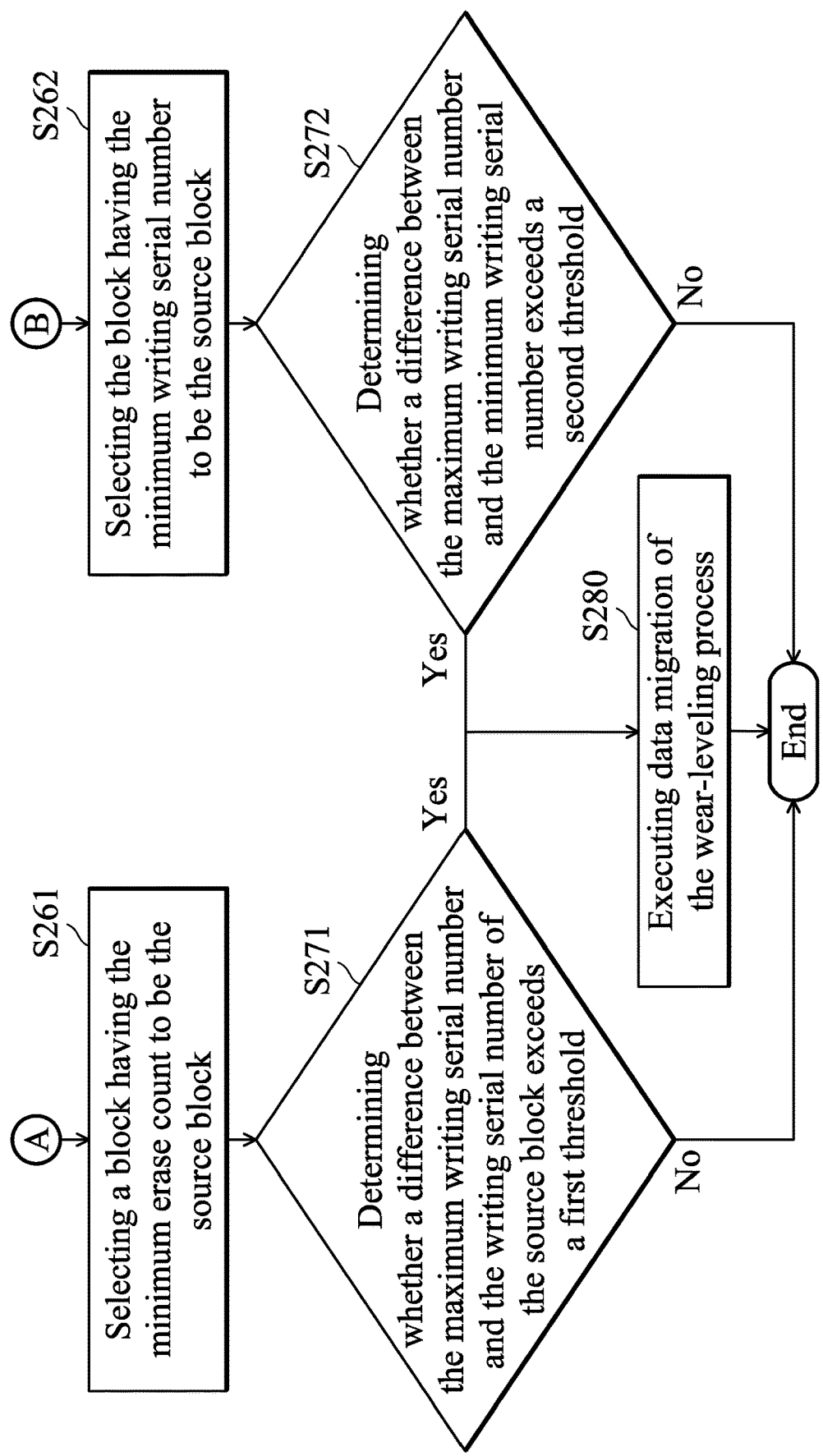

FIGS. 2A-2B are flow charts of a data retention method in accordance with an embodiment of the invention. According to an embodiment of the invention, the controller 120 is configured to execute a data retention method 200 on the flash memory array 110. The following paragraphs will be accompanied by FIG. 1 and FIGS. 2A-2B for a detailed explanation.

First, the controller 120 executes the erase operation on an erase block in the flash memory array 110 (Step S210). According to an embodiment of the invention, when the controller 120 finishes erasing the data stored in the erase block, the controller 120 increases the total erase count of the flash memory array 110 by 1 and calculates the average erase count ECave by using the total erase count and the number of blocks in the flash memory array 110.

When the controller 120 finishes the erase operation, the controller 120 maintains the minimum erase count ECmin and the minimum erase number EC_NUM of the flash memory array 110 (Step S220), in which the number of blocks in the flash memory array 110 that have the minimum erase count ECmin is defined as the minimum erase number EC_NUM.

According to an embodiment of the invention, every time that the erase block is one of the blocks having the minimum erase count ECmin, the controller 120 subtracts 1 from the minimum erase number EC_NUM. When the minimum erase number EC_NUM is equal to 0, the controller 120 increases the minimum erase count ECmin by 1 and scans the erase count of each block in the flash memory array 110 once again. The controller 120 also determines the minimum erase number EC_NUM once again according to the erase counts of all blocks in the flash memory array 110. According to an embodiment of the invention, the scan operation is configured to determine the number of blocks having an erase count that is equal to the new minimum erase count ECmin to be the new minimum erase number EC_NUM. According to another embodiment of the invention, the scan operation is configured to compare the erase counts of all blocks to determine the new minimum erase count ECmin and to select the number of blocks having the new minimum erase count ECmin to be the new minimum erase number EC_NUM.

According to an embodiment of the invention, when the storage device 100 is manufactured, the minimum erase count ECmin is set to 0 and the initial value of the minimum erase number EC_NUM is set to the total number of blocks in the flash memory array 110. Once there is any one of the blocks is erased, the controller 120 subtracts 1 from the minimum erase number EC_NUM. When all blocks have been erased at least once, the minimum erase number EC_NUM is equal to 0. At the meanwhile, the minimum erase count ECmin is increased by 1 (to be 1). The erase counts of all blocks in the flash memory array 110 are then scanned once again to select the number of blocks having erase counts equal to the minimum erase count ECmin, which is equal to 1 now, to be the minimum erase number EC_NUM. When a block having the minimum erase count ECmin, which is equal to 1 now, is erased once again, the controller 120 subtracts 1 from the minimum erase number EC_NUM. When the minimum erase number EC_NUM obtained by a previous scan is decreased to 0, the controller 120 increases the minimum erase count ECmin by 1 (to be 2), re-scans the erase counts of all blocks in the flash memory array 110, and selects the number of blocks having an erase count equal to the new minimum erase count ECmin, which is equal to 2, to be the minimum erase number EC_NUM. The following process is repeated as stated above until the minimum erase count ECmin reaches the maximum allowable erase count of the blocks in the flash memory array 110.

In addition, after the update operation mentioned above, the controller 120 stores the minimum erase count ECmin and the minimum erase number EC_NUM in the flash memory array 110. The minimum erase count ECmin and the minimum erase number EC_NUM stored in the flash memory array 110 could not be lost when the power is turned OFF. When the minimum erase count ECmin is required, it can be read out from a specific address in the flash memory array 110.

In other words, it is assumed that the maximum allowable erase count of the blocks in the flash memory array 110 is a predetermined value, which means that the data could not be written once the erase counts of the blocks in the flash memory array 110 have reached the predetermined value. Therefore, the number of scan operations mentioned above that the controller 120 executes to determine the minimum erase number EC_NUM is equal to the predetermined value. However, the predetermined value may be not high. For example, when the flash memory array 110 is adopted with the Trinary-level cell (TLC) technology which has less life time, the maximum allowable erase count of the blocks is, for example, 300. In the life time of the flash memory array 110, the scan operation should be executed 300 times. Comparing with the technical solution that all blocks should be thoroughly scanned, and all the erase counts should be compared with one another for obtaining the minimum erase count ECmin when the minimum erase count ECmin is required, the data retention method provided herein would prevent the controller 120 from frequently scanning the flash memory array 110 such that the host spends less hardware resources to scan the flash memory array 110. In addition, since the minimum erase count ECmin and the minimum erase number EC_NUM are stored in the flash memory array 110, the minimum erase count ECmin and the minimum erase number EC_NUM could be preserved when the power is suddenly lost.

Then, the controller 120 determines whether the difference between the erase count of the erased block and the minimum erase count ECmin exceeds a target threshold TH (Step S230). When the difference between the erase count of the erased block and the minimum erase count ECmin exceeds the target threshold TH, the erased block is selected to be target block for data migration of a wear-leveling process (Step S240). Otherwise, when the controller 120 determines in Step S230 that the difference between the erase count of the erased block and the minimum erase count ECmin does not exceed the target threshold TH, the controller 120 terminates the data retention method 200. Namely, the wear-leveling process is not executed on the erased block for data migration.

Figure 3:
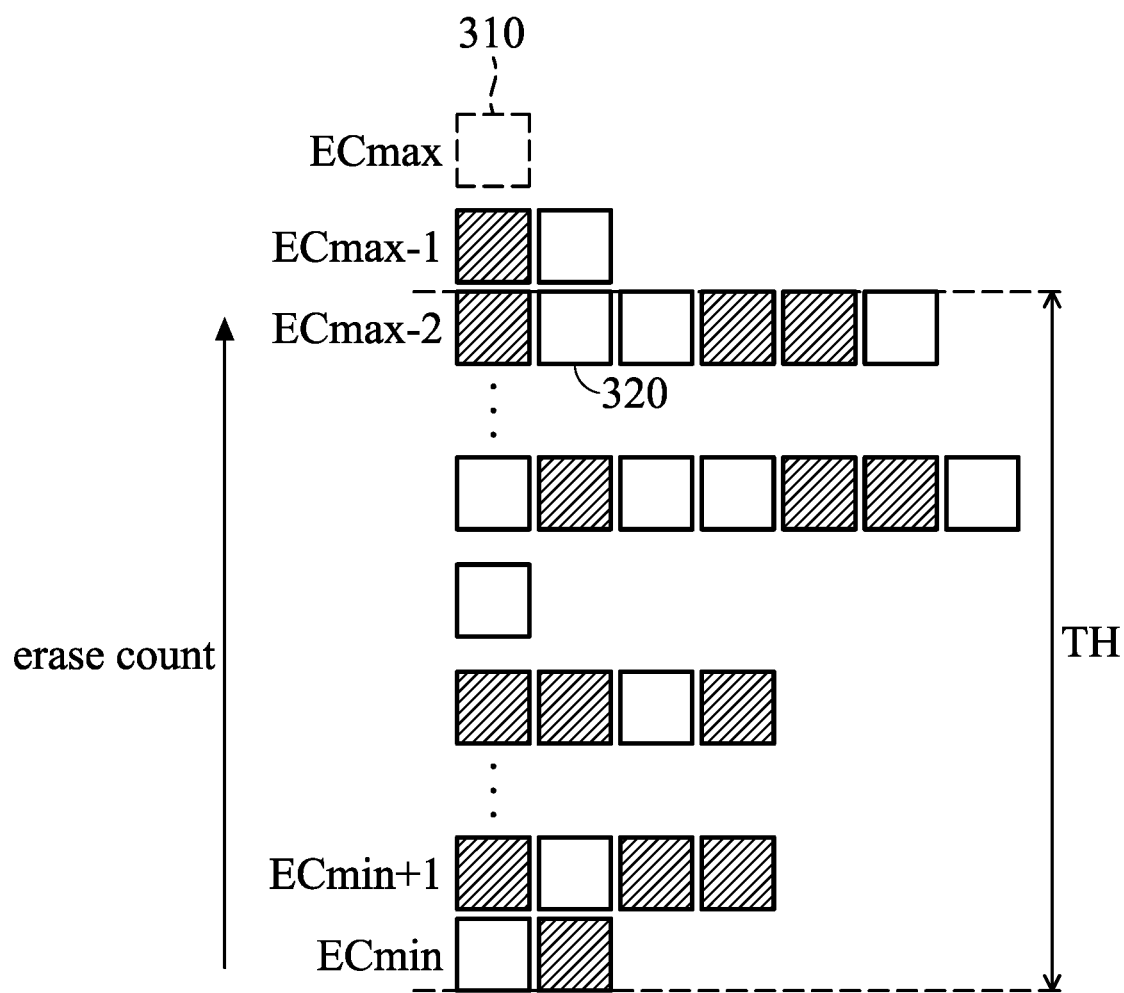
FIG. 3 shows a distribution of the erase counts of a flash memory array in accordance with an embodiment of the invention.

FIG. 3 shows a distribution of the erase counts of a flash memory array in accordance with an embodiment of the invention. As shown in FIG. 3, the number of blocks in the flash memory array 110 having the minimum erase number ECmin is 1, and the number of blocks having the maximum erase count ECmax is 1, in which the square filled with slashes indicates that a block is full of data (i.e., is filled) and a white square indicates that an idle block (i.e., an empty block). It should be noted that FIG. 3 is for illustration but not intended to be limited thereto. For example, the number of blocks having the minimum erase count ECmin and that of the blocks having the maximum erase count ECmax may be plural.

According to an embodiment of the invention, the erased block in Step S230 of the data retention method 200 is the first block 310. Since the erase count of the first block 310 is the maximum erase count ECmax, the difference between the erase count of the first block 310 and the minimum erase count ECmin exceeds the target threshold TH such that the controller 120 selects the first block 310 to be the target block for data migration of the wear-leveling process. According to another embodiment of the invention, the erased block of Step S230 in the data retention method 200 is the second block 320. Since the difference between the erase count of the second block 320 and the minimum erase count ECmin does not exceed the target threshold TH, the controller 120 terminates the data retention method 200, which means that the wear-leveling process is not executed on the erased block (i.e., the second block 320) for data migration.

Back to Step S240, when the controller 120 selects the erased block to be the target block for data migration of the wear-leveling process, the controller 120 further determines whether the difference between the average erase count ECave of the flash memory array 110 and the minimum erase count ECmin exceeds the cold-data threshold THC (Step S250). When it is determined that the difference between the average erase count ECave and the minimum erase count ECmin exceeds the cold-data threshold THC, the controller 120 selects a block having the minimum erase count ECmin to be the source block (Step S261).

Figure 4:
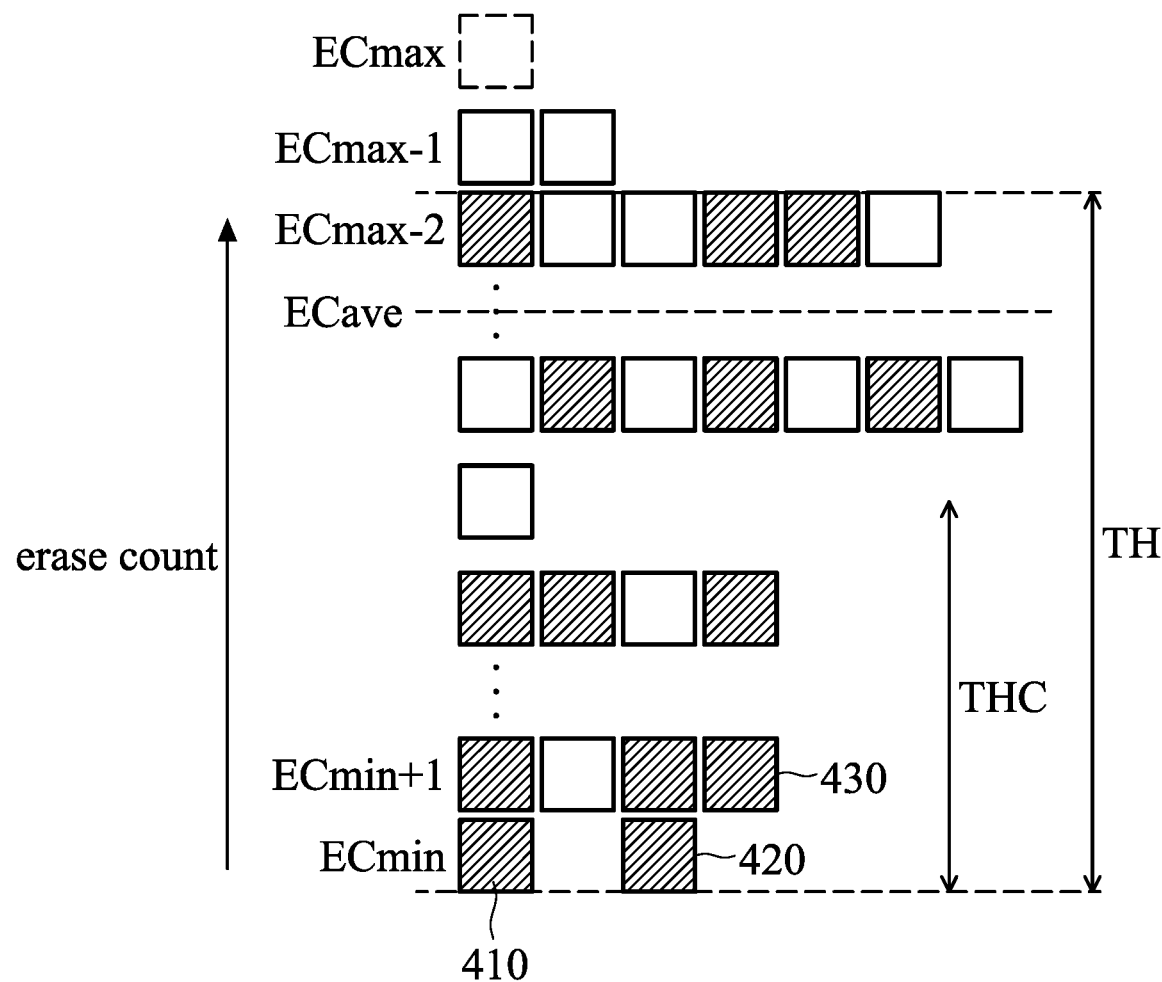
FIG. 4 shows a distribution of the erase counts of a flash memory array in accordance with another embodiment of the invention.

FIG. 4 shows a distribution of the erase counts of a flash memory array in accordance with another embodiment of the invention. As shown in FIG. 4, since the difference between the average erase count of the flash memory array 110 and the minimum erase count Ecmin exceeds the cold-data threshold THC, the controller 120 selects the third block 410 having the minimum erase count ECmin to be the source block. It should be noted that the number of blocks having the minimum erase count ECmin and the number of those having the maximum erase count ECmax may both be plural, but it is not intended to be limited to the number shown in FIG. 4.

When the difference between the average erase count ECave and the minimum erase count ECmin exceeds the cold-data threshold THC, this indicates that the growth rate of the minimum erase count ECmin is too slow. The controller 120 selects a block having the minimum erase count ECmin to be the source block so that the blocks having the minimum erase count ECmin could be able to be worn and the erase counts of all blocks in the flash memory array 110 are then balanced.

According to an embodiment of the invention, the controller 120 also maintains a writing serial number WSN corresponding to each block in the flash memory array 110. The writing serial number WSN records the time attribution about the data (i.e., the data is new or old) being written to a block and is assigned a value when a block is filled, which indicates the order of the blocks being filled. A block having the minimum writing serial number WSNmin indicates that the block is the earliest one that has been filled, while a block having the maximum writing serial number WSNmax indicates that the block is the latest one that has been filled. It should be noted that, according to an embodiment of the invention, the writing serial number WSN of each block is assigned a value when the block is filled. When the block is erased, the writing serial number WSN is cleared as well. The writing serial number WSN would not be assigned a value again until the corresponding block has been filled again.

Back to Step S261 in FIG. 2B, when a block having the minimum erase number ECmin is selected to be the source block, the controller 120 further determines whether the difference between the maximum writing serial number WSNmax and the writing serial number WSNsrc of the source block exceeds a first threshold (Step S271), in which the source block is the block having the minimum erase count ECmin that has been selected in Step S261. If the difference between the maximum writing serial number WSNmax and the writing serial number WSNsrc of the source block exceeds the first threshold, this indicates that the source block has been filled for a long time and that the data stored in the source block is indeed cold data. Therefore, the controller 120 executes data migration of the wear-leveling process (Step S280).

Back to Step S271, when the difference between the maximum writing serial number WSNmax and the writing serial number WSNsrc of the source block does not exceed the first threshold, this indicates that the data stored in the source block may just have been written a moment ago, and that the data stored in the source block may not be determined to be cold data. In such circumstances, if data migration of the wear-leveling process, in which the data of the source block would be moved to the target block, were executed, the opportunity of the target block being erased might not be reduced, which results in the wear-leveling process being invalid. Therefore, the controller 120 terminates the data retention method 200 now or returns to Step S261 to re-select another block having the minimum erase count ECmin to be the source block.

Referring to FIG. 4, according to an embodiment of the invention, when the controller 120 executes the data migration of the wear-leveling process, only the valid data in the source block is moved to the target block such that the data stored in the selected third block 410 may not be enough to fill the target block. The controller 120 also selects another block having the minimum erase count ECmin, such as the fourth block 420, to be the source block. If the total valid data stored in all the blocks that have the minimum erase count ECmin, such as the third block 410 and the fourth block 420, may not fill the target block, the controller 120 further selects one of the blocks having the sub-minimum erase count ECmin+1 to be the source block. There are 4 blocks having the sub-minimum erase count ECmin+1, and the controller 120 randomly selects one of the blocks 430. It should be noted that the source block is usually a filled block, but it is not intended to be limited thereto.

Back to Step S250 of the data retention method 200, when it is determined that the difference between the average erase count ECave and the minimum erase count ECmin does not exceed the cold-data threshold THC, the controller 120 selects the block having the minimum writing serial number to be the source block (Step S262).

Figure 5:
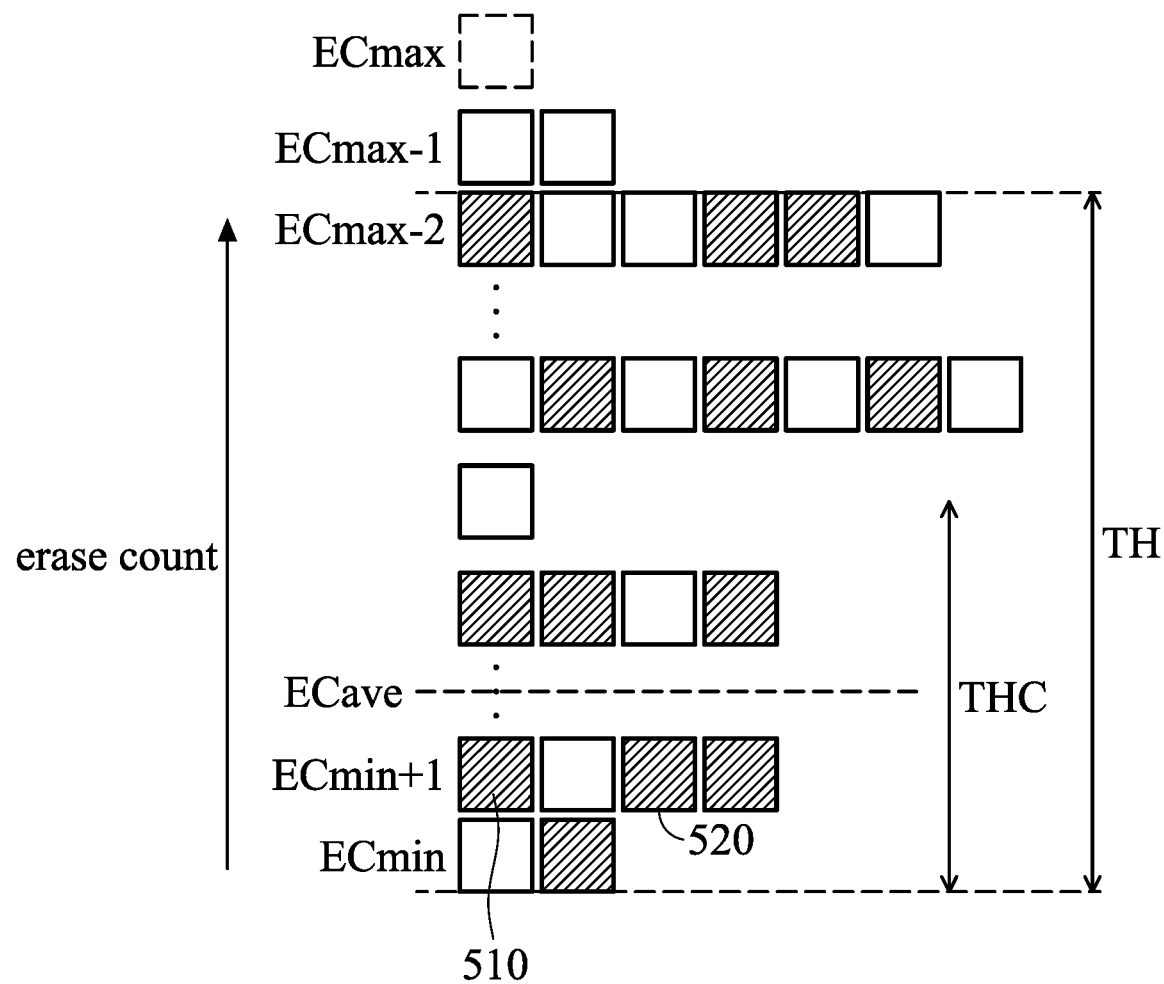
FIG. 5 shows a distribution of the erase counts of a flash memory array in accordance with yet another embodiment of the invention.

FIG. 5 shows a distribution of the erase counts of a flash memory array in accordance with yet another embodiment of the invention. As shown in FIG. 5, since the difference between the average erase count ECave in the flash memory array 110 and the minimum erase count ECmin is less than the cold-data threshold THC, the controller 120 selects the fifth block 510 and/or the sixth block 520, which has/have the minimum writing serial number WSNmin, to be the source block. It should be noted that the number of blocks having the minimum writing serial number WSNmin, the number of blocks having the minimum erase count ECmin, and the number of blocks having the maximum erase count ECmax may all be plural, but it is not intended to be limited to the number shown in FIG. 5.

When the difference between the average erase count ECave and the minimum erase count ECmin does not exceed the cold-data threshold THC, this indicates that the growth rate of the maximum erase count ECmax is too fast. The controller 120 selects a block having the minimum writing serial number WSNmin to be the source block such that the cold data on the source block is configured to freeze the target block for stopping the erase count being further increased. The erase counts of all blocks in the flash memory array 110 are therefore balanced. It should be noted that the data stored in the blocks having the minimum writing serial number WSNmin should be relatively cold data. When one of the blocks having the minimum writing serial number WSNmin is selected to be the source block for data migration of the wear-leveling process and the cold data is moved to the target block that has been erased, the probability of the target block being erased in the future could be lowered such that the purpose of the wear-leveling process could be realized. In order to guarantee that the data stored in the blocks having the minimum writing serial number WSNmin is the cold data, according to an embodiment of the invention, the minimum writing serial number WSNmin selected by the controller 120 in Step S262 is not the minimum writing serial number WSN of the whole flash memory array 110, but is the minimum writing serial number WSN of the blocks having the erase counts less than the average erase count ECave.

Back to Step S262 in FIG. 2B, when one of the blocks having the minimum writing serial number WSNmin is selected to be the source block, the controller 120 also determines whether the difference between the maximum writing serial number WSNmax and the minimum writing serial number WSNmin exceeds a second threshold (Step S272). According to an embodiment of the invention, the second threshold may be, for example, the total number of blocks in the flash memory array 110 multiplied by a factor (for example, of 3 or 4). When the difference between the maximum writing serial number WSNmax and the minimum writing serial number WSNmin exceeds the second threshold, this indicates that the blocks having the minimum writing serial number WSNmin haven't been written to, since all the blocks in the flash memory array 110 have been filled 3-4 times after the blocks having the minimum writing serial number WSNmin was filled. Therefore, the data stored in the blocks having the minimum writing serial number WSNmin is ensured to be cold enough, in order to prevent a situation of all blocks being hot in which even the blocks having the minimum writing serial number WSNmin also store hot data. The second threshold could be set to any other value by experience, and the invention is not intended to be limited thereto. When the difference between the maximum writing serial number WSNmax and the minimum writing serial number WSNmin exceeds the second threshold, this indicates that the data stored in the source block is indeed cold data so that the controller 120 can execute the data migration of the wear-leveling process (Step S280). According to an embodiment of the invention, the second threshold is greater than the first threshold. The purpose of one of the blocks having the minimum erase count ECmin is selected to be the source block for the wear-leveling process in Step S261 is to increase the possibility of the blocks having the minimum erase count ECmin being erased. Therefore, it is not necessary for the data stored in the block selected in Step S261 to be very cold such that the first threshold in Step S261 may be less than the second threshold.

Back to Step S272, when the difference between the maximum writing serial number WSNmax and the minimum writing serial number WSNmins does not exceed the second threshold, whether the data stored in the source block is cold cannot be determined. In such a situation, the possibility of the target block being erased may not be reduced by executing the data migration of the wear-leveling process to move the data stored in the source block to the target block. Therefore, the controller 120 terminates the data retention method 200 or returns Step S262 to re-select another block to be the source block.

When the controller 120 executes the data migration of the wear-leveling process (Step S280), the controller 120 selects at least one block to be the source block and moves the valid data stored in the source block to the target block. In addition, when the valid data stored in the source block has been moved to the target block, the controller 120 erases the source block for further use. According to an embodiment of the invention, the controller 120 selects a block to be the source block. When the valid data in the selected block is not enough to fill the target block, the controller 120 may select another block according to the selection criteria described above. According to another embodiment of the invention, the controller 120 may select at least two blocks to be the source blocks. When the valid data stored in the selected two blocks is not enough to fill the target block, the controller 120 may select other two blocks according to the selection criteria.

Referring to FIG. 5, according to an embodiment of the invention, when the controller 120 executes the wear-leveling process, only the valid data of the source block is moved to the target block. Therefore, the data stored in the fifth block 510 or the sixth block 520 may not be enough to fill the target block. According to an embodiment of the invention, when the valid data of the fifth block 510 or the sixth block 520 is not enough to fill the target block, the controller 120 then selects another block having the minimum writing serial number WSNmin to be the source block. According to an embodiment of the invention, when the valid data of the block having the minimum writing serial number WSNmin has been moved to the target block, the controller 120 may further select a block having the sub-minimum writing serial number WSNmin+1.

According to another embodiment of the invention, when the difference between the average erase count ECave and the minimum erase count ECmin does not exceed the cold-data threshold THC, the controller 120 selects at least one block having the erase count less than the average erase count ECave and having the minimum writing serial number WSNmin to be the source block. According to the embodiment illustrated in FIG. 5, the controller 120 may select the fifth block 510 or the sixth block 520 having the minimum writing serial number WSNmin, or may simultaneously select both the fifth block 510 and the sixth block 520 having the minimum writing serial number WSNmin.

It should be noted that when Step S271 and Step S272 are determined to be NO, the controller 120 may cancel the data migration. In some embodiments of selecting multiple source blocks, the cancellation operation mentioned above may be applied to only the first source block, and the following source blocks selected according to Step S261 and Step S262 may not be determined according to Step S271 and Step S272.

In addition, when the controller 120 has executed the data migration of the wear-leveling process in Step S280, the target block is filled by the migrated data and the writing serial number of the target block is generally to be assigned to be the maximum writing serial number WSNmax of the flash memory array 110. However, since the migrated data comes from the source block instead of from the host, the migrated data is usually older data such that the maximum writing serial number WSNmax may not be able to indicate the time sequence (i.e., new or old) of the migrated data. According to an embodiment of the invention, when the data migration of the wear-leveling process in Step S280 has been executed, the controller 120 updates the writing serial number of the target block to be that of the source block.

Figure 6:
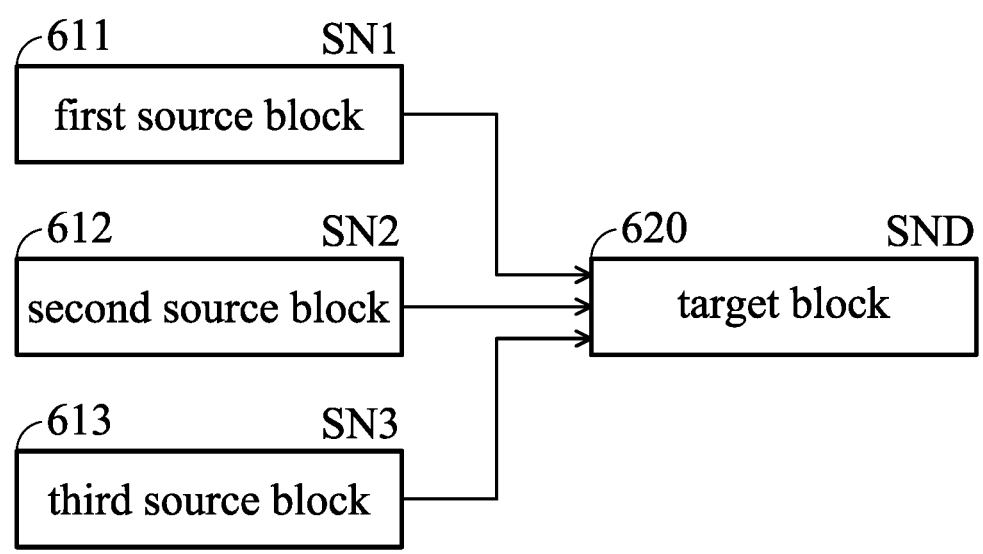
FIG. 6 illustrates the data migration of a wear-leveling process in accordance with an embodiment of the invention.

FIG. 6 illustrates the data migration of a wear-leveling process in accordance with an embodiment of the invention. As shown in FIG. 6, the controller 120 moves the valid data of a first source block 611, a second source block 612, and a third source block 613 to a target block 620, in which the first source block 611 has a first writing serial number WSN1, the second source block 622 has a second writing serial number WSN2, the third source block 623 has a third writing serial number WSN3, and the target block 620 has a target writing serial number WSND.

According to an embodiment of the invention, when the controller 120 has moved only the valid data of the first source block 611, the second source block 612, and the third source block 613 to fill the target block 620, the controller 120 compares the first writing serial number WSN1, the second writing serial number WSN2, or the third writing serial number WSN3, and assigns the largest one among the first writing serial number WSN1, the second writing serial number WSN2, and the third writing serial number WSN3 to the target writing serial number WSND.

According to another embodiment of the invention, when the controller 120 has moved only the valid data of the first source block 611, the second source block 612, and the third source block 613 to fill the target block 620, the controller 120 compares the ratios that the space of the target block 620 is occupied by the valid data of the first source block 611, the second source block 612, and the third source block 613, and assigns the writing serial number WSN of the block having the most valid data to the target writing serial number WSND.

For example, the ratios of the space in the target block 620 occupied by the valid data of the first source block 611, the second source block 612, and the third source block 613 are respectively: 45%, 30%, and 25%. Namely, 45% space of the target block 620 is filled with the valid data of the first source block 611, 30% space of the target block 620 is filled with the valid data of the second source block 612, and 25% space of the target block 620 is filled with the valid data of the third source block 613. The controller 120 determines that the ratio of the space in the target block 620 occupied by the valid data of the first source block 611 is the highest such that the controller 120 assigns the first writing serial number SN1 corresponding to the first source block 611 to the target writing serial number WSND.

The data retention method provided herein selects blocks having the minimum erase count or the minimum writing serial number based on different situations to be the source block of the data migration of the wear-leveling process. When the block having the minimum erase count has been selected to be the source block, there is a greater opportunity for the block with the minimum erase count to be used, balancing the overall erase counts of the flash memory array and reducing or eliminating the number of blocks with erase counts that are too low. When the block having the minimum writing serial number has been selected to be the source block, this indicates that the data that has been written the earliest (i.e., cold data) is moved to the block that has been frequently erased and written such that the erase count of the target block can be then frozen, and the maximum erase count of the flash memory array is prevented from being increased too fast. The overall erase counts of the flash memory array are therefore balanced. The data retention method provided herein takes reasonable care of the separated cold data and the cold blocks (i.e., blocks having a lower erase count) according to the recent erase states of all blocks so that the selection of the source block is more individualized.

The data retention method provided herein also includes a cancel mechanism which is configured to prevent from moving the hot data (i.e., the data that needs to be frequently written) to induce the invalid data migration, resulting in increased erase counts and loss of system resource. Therefore, the data retention method provided herein may more effectively balance the erase counts of the flash memory array, and the life time of the flash memory array is then improved.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data retention method adopted for a flash memory array, wherein the flash memory array comprises a plurality of blocks, wherein a minimum erase number of blocks have a minimum erase count among all the blocks of the flash memory array, comprising:
   erasing one of the minimum erase number of blocks;
   when one of the minimum erase number of blocks is erased, the minimum erase number is decreased by 1 and the decreased minimum erase number is stored into the flash memory array; and
   when the minimum erase number is decreased to 0, the minimum erase count is increased by 1 and the increased minimum erase count is stored into the flash memory array;
   wherein the minimum erase count is the least of erase counts of all the blocks of the flash memory array, and
   wherein the minimum erase number is a total number of blocks having the minimum erase count among all the blocks of the flash memory array;
   wherein after the minimum erase count is increased by 1, the erase counts of all the blocks of the flash memory array are scanned, and the minimum erase number is determined once again according to the scanned erase counts of all the blocks in the flash memory array.

2. The data retention method of claim 1, wherein, when the storage device is manufactured, the minimum erase count is set 0 and the minimum erase number is set to be a total number of the plurality of blocks.

3. The data retention method of claim 1, wherein when the minimum erase count and/or the minimum erase number is/are updated, the minimum erase count and the minimum erase number are stored in the flash memory array.

4. The data retention method of claim 1, wherein the flash memory array further comprises an average erase count, the data retention method further comprising:

determining whether a difference between the average erase count of the plurality of blocks and the minimum erase count exceeds a cold-data threshold; and when the difference between the average erase count of the plurality of blocks and the minimum erase count exceeds the cold-data threshold, selecting a first block having the minimum erase count to be a source block, wherein when a data migration of a wear-leveling process is executed, data stored in the source block is moved to a target block.

5. The data retention method of claim 4, further comprising:

erasing data stored in a second block among the plurality of blocks;

when the data of the second block has been erased, determining whether a difference between a current erase count of the second block and the minimum erase count exceeds a target threshold; and when the difference between the current erase count and the minimum erase count exceeds the target threshold, selecting the second block to be the target block.

6. The data retention method of claim 4, wherein the first block has a first writing serial number, a third block among the plurality of blocks has a maximum writing serial number, and the first writing serial number and the maximum writing serial number respectively indicate a time sequence in which the first block and the third block have been filled, wherein the third block is the latest one that has been filled among the plurality of blocks, wherein after the step of selecting the first block to be the source block, the data retention method further comprises:

determining whether a difference between the maximum writing serial number and the first writing serial number exceeds a first threshold; and if the difference between the maximum writing serial number and the first writing serial number does not exceed the first threshold, not executing the data migration of the wear-leveling process.

7. The data retention method of claim 4, wherein after the step of determining whether the difference between the average erase count of the plurality of blocks and the minimum erase count exceeds the cold-data threshold, the data retention method further comprises:

when the difference between the average erase count and the minimum erase count does not exceed the cold-data threshold, selecting a fourth block among the plurality of blocks to be the source block, wherein the fourth block has a minimum writing serial number.

8. The data retention method of claim 7, wherein the fourth block is the earliest one that has been filled among the plurality of blocks with a lower erase count than the average erase count.

9. The data retention method of claim 7, wherein a third block among the plurality of blocks has a maximum writing serial number and the third block is the latest one that has been filled among the blocks, wherein after the step of selecting the fourth block of the flash memory array to be the source block, the data retention method further comprises:

determining whether a difference between the maximum writing serial number and the minimum writing serial number exceeds a second threshold, wherein the second threshold exceeds the first threshold; and if the difference between the maximum writing serial number and the minimum writing serial number does not exceed the second threshold, not executing the data migration of the wear-leveling process.

10. A storage device, comprising:

a flash memory array, comprising a plurality of blocks, wherein a minimum erase number of blocks have a minimum erase count among all the blocks of the flash memory array, wherein the minimum erase count is the least of erase counts of all the blocks of the flash memory array, wherein the minimum erase number is a total number of blocks having the minimum erase count among all the blocks of the flash memory array; and a controller, maintaining the minimum erase count and the minimum erase number, wherein when one of the minimum erase number of blocks is erased, the controller subtracts 1 from the minimum erase number and stores the subtracted minimum erase number into the flash memory array, wherein when the minimum erase number is decreased to 0, the controller increases the minimum erase count by 1 and stores the increased minimum erase count into the flash memory array;

wherein after the minimum erase count is increased by 1, the erase counts of all the blocks of the flash memory array are scanned, and the minimum erase number is determined once again according to the scanned erase counts of all the blocks in the flash memory array.

11. The storage device of claim 10, wherein, when the storage device is manufactured, the minimum erase count is set to 0 and the minimum erase number is set to be a total number of the plurality of blocks.

12. The storage device of claim 10, wherein when the controller updates the minimum erase count and/or the minimum erase number, the controller stores the minimum erase count and the minimum erase number in the flash memory array.

13. The storage device of claim 10, wherein when the controller determines that a difference between an average erase count of the plurality of blocks and the minimum erase count exceeds a cold-data threshold, the controller selects a first block having the minimum erase count to be a source block, wherein when a data migration of a wear-leveling process is executed, the controller moves data stored in the source block to a target block.

14. The storage device of claim 13, wherein after the controller has erased data stored in a second block among the plurality of blocks, when the controller determines that a difference between a current erase count of the second block and the minimum erase count exceeds a target threshold, the controller selects the second block to be the target block.

15. The storage device of claim 13, wherein the first block has a first writing serial number, a third block among the plurality of blocks has a maximum writing serial number, and the first writing serial number and the maximum writing serial number respectively indicate a time sequence in which the first block and the third block have been filled, wherein the third block is the latest one that has been filled among the blocks, wherein the controller further determines whether a difference between the maximum writing serial number and the first writing serial number exceeds a first threshold, wherein if the difference between the maximum writing serial number and the first writing serial number does not exceed the first threshold, the controller does not execute the data migration of the wear-leveling process.

16. The storage device of claim 13, wherein when a difference between the average erase count and the minimum erase count does not exceed the cold-data threshold, the controller selects a fourth block to be the source block, wherein the fourth block has a minimum writing serial number.

17. The storage device of claim 16, wherein the fourth block is the earliest one being filled among the plurality of blocks with a lower erase count than the average erase count.

18. The storage device of claim 16, wherein a third block among the plurality of blocks has a maximum writing serial number and the third block is the latest one that has been filled among the blocks, wherein the controller further determines whether a difference between the maximum writing serial number and the minimum writing serial number exceeds a second threshold, wherein if the difference between the maximum writing serial number and the minimum writing serial number does not exceed the second threshold, the controller does not execute the data migration of the wear-leveling process.

\* \* \* \* \*